United States Patent [19]

Kiyokawa et al.

[11] Patent Number: 5,177,435
[45] Date of Patent: Jan. 5, 1993

[54] IC TEST EQUIPMENT

[75] Inventors: Toshiyuki Kiyokawa, Kitakatsushika; Noriyuki Igarashi; Hisao Hayama, both of Gyoda, all of Japan

[73] Assignee: Advantest Corporation, Tokyo, Japan

[21] Appl. No.: 774,821

[22] Filed: Oct. 11, 1991

[30] Foreign Application Priority Data

Oct. 12, 1990 [JP] Japan .................... 2-106947[U]

[51] Int. Cl.$^5$ .............................................. G01R 31/02
[52] U.S. Cl. ............................. 324/158 F; 324/158 P
[58] Field of Search ............ 324/158 F, 158 P, 158 R, 324/73.1; 209/573; 901/40

[56] References Cited

U.S. PATENT DOCUMENTS 4,908,126  3/1990  Willberg et al. ................ 324/158 F
4,997,552  3/1991  Schlinkmann et al. ......... 324/158 F
5,023,544  6/1991  Vallone et al. .................. 324/158 F
5,077,523  12/1991  Blanz ............................. 324/158 F Primary Examiner—Ernest F. Karlsen
Attorney, Agent, or Firm—Staas & Halsey

[57] ABSTRACT

A vertical drive unit is mounted on a fixed beam provided above a performance board for testing IC elements and fixed to a support frame. An X-Y carrier head of an X-Y transport unit mounted on the support frame is movable in a planar area including space between the vertical drive unit and the performance board. The X-Y carrier head has a vertical guide, by which an air chuck for sucking up and holding an IC element is supported so that it is movable in the vertical direction. The X-Y carrier head is brought to a predetermined position above the test head, the air chuck is brought down by the vertical drive unit, and then terminals of the IC element are pressed into contact with an IC socket on the performance board at a predetermined pressure.

5 Claims, 3 Drawing Sheets

IC TEST EQUIPMENT

BACKGROUND OF THE INVENTION

The present invention relates to IC test equipment of the type wherein IC elements to be tested are carried by a horizontal carrier mechanism to testing stations.

FIG. 1 shows an IC transport mechanism of IC test equipment employing a conventional horizontal transport system.

An X-Y carrier head 1H has air chucks 3A and 3B. The X-Y carrier head 1H picks up IC elements 4 by the air chucks and travels to a desired position, where the IC elements 4 are placed on sockets 5A and 5B provided on a performance board PB on a test head TH and then are subjected to a test. After the test the X-Y carrier head 1H lifts up the IC elements 4 from the sockets 5A and 5B and brings them to a predetermined position. The X-Y carrier head 1H is provided with vertical guides 6A and 6B for supporting the air chucks 3A and 3B in a manner to be movable in the vertical direction and vertical drivers 7A and 7B for moving the air chucks 3A and 3B in the vertical direction. The vertical drivers 7A and 7B are, for example, air cylinders or similar drivers.

The vertical drivers 7A and 7B not only move the air chucks 3A and 3B in the vertical direction but also urge them against the sockets 5A and 5B on the performance board PB, i.e. press terminal portions of the IC elements 4 into contact with terminals of the sockets 5A and 5B to ensure establishment of electrical contact therebetween. The pressure needed in this case is about 30 kg per IC element 4. Accordingly, cylinders each capable of producing a driving force of 30 kg or so are used as the vertical drivers 7A and 7B for urging the two IC elements 4 into contact with the sockets 5A and 5B as shown.

Such a large driving force is not needed for only moving up and down the air chucks 3A and 3B, but the driving force is necessary for bringing the IC elements 4 into electrical contact with the sockets 5A and 5B and maintaining the contact during the test. A large and consequently heavy air cylinder is required for generating such a large driving force. This inevitably increases the total weight of the X-Y carrier head 1H. In addition, when the IC elements 4 are being urged against the sockets 5A and 5B, the X-Y carrier head 1H is subjected to an upward reaction force of 30×2 kg. Consequently, a reaction force of about 60 kg is also applied to a Y-axis guide rail 1Y supporting the X-Y carrier head 1H; accordingly, it is necessary that the whole structure of an X-Y transport unit 10 be also rigid enough to withstand the reaction force.

As a result of this, however, the weight of the X-Y carrier head 1H itself and consequently the total weight of the X-Y transport unit 10 increases—this hinders speedup of operations of the X-Y carrier head and hence constitutes a serious obstacle to the reduction of the test time.

SUMMARY OF THE INVENTION

It is therefore an object of the present invention to provide IC test equipment which affords reduction of the weight of the X-Y transport unit, and hence permits speeding up of operations of the X-Y carrier head and shortening of the test time.

According to the present invention, the vertical drivers are removed from the conventional X-Y carrier head but instead they are mounted on a beam fixed to a support frame of a horizontal transport unit. The X-Y carrier head is brought to a predetermined position between the vertical drivers and the performance board and the air chucks are lowered by the vertical drivers, and if necessary, IC elements are urged against the sockets.

Since the vertical drivers are removed from the X-Y carrier head as mentioned above, the weight of the X-Y carrier head itself can be reduced, besides the pressure to the socket by the vertical drivers is not applied as reaction force to the X-Y transport unit. Thus, the structure according to the present invention does not call for high rigidity of the X-Y transport unit and permits reduction of its total weight as well. Hence, the IC test equipment of the present invention operates at a high speed and consequently carries IC elements very quickly, thereby producing the effect of shortening the IC test time.

DESCRIPTION OF THE PREFERRED EMBODIMENT

Figure 1:
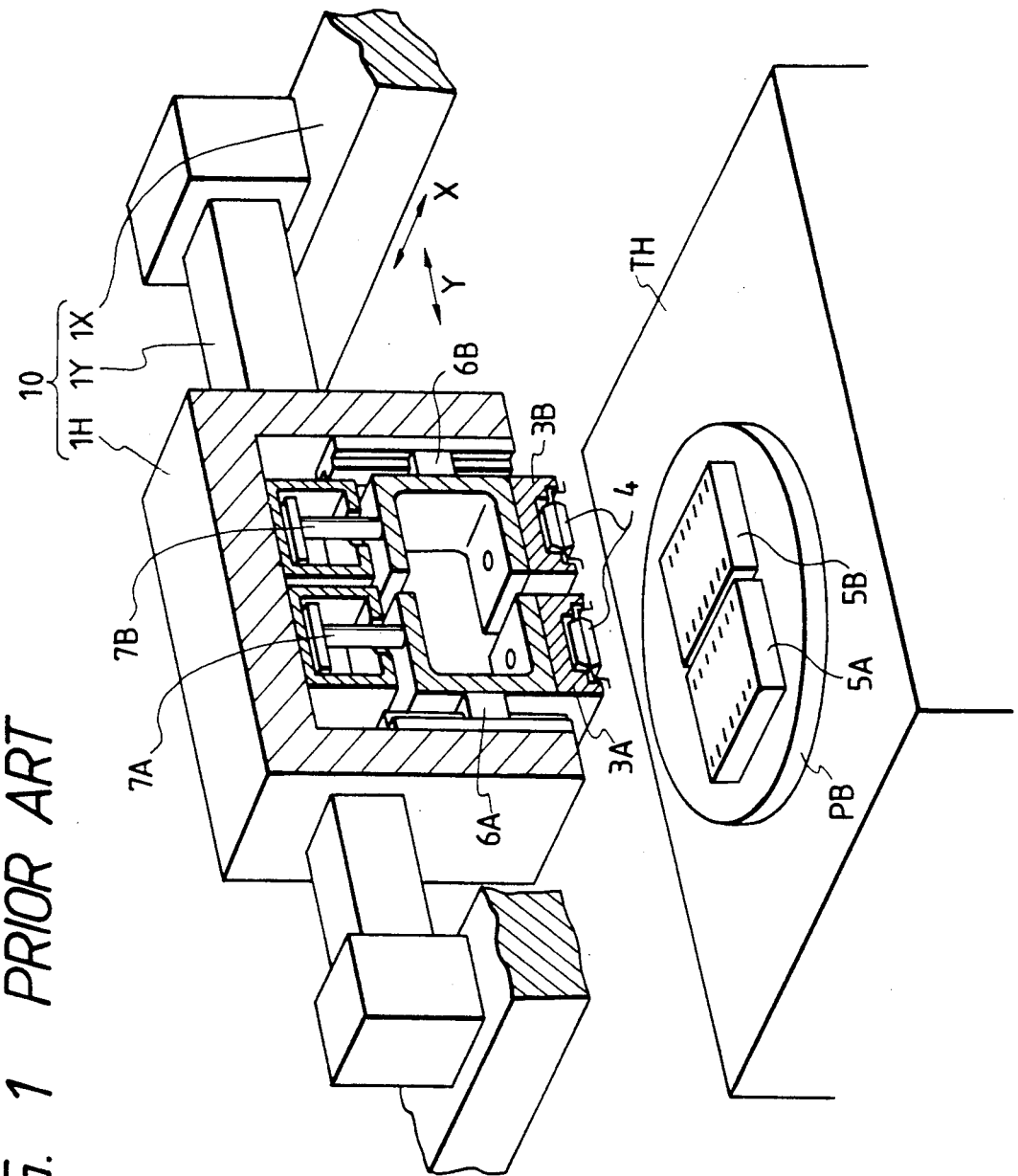
FIG. 1 is a perspective view, partly in section, showing an IC transport mechanism of a conventional horizontal transport type IC test equipment.
Figure 2:
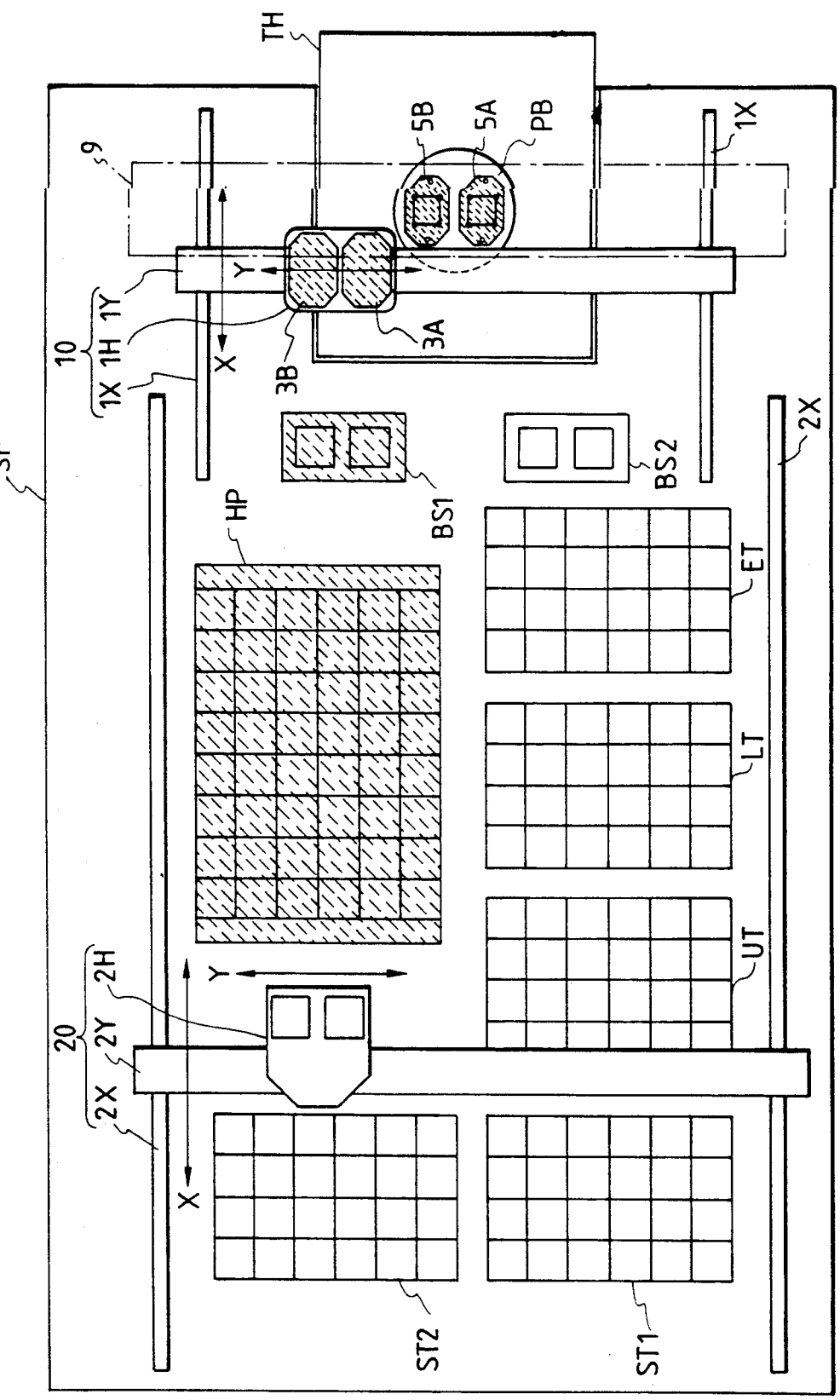
FIG. 2 is a plan view mainly illustrating a horizontal t mechanism of IC test equipment embodying the invention.

FIG. 2 is a plan view mainly illustrating the horizontal transport mechanism of IC test equipment embodying the present invention. In this example, there are mounted on a support frame SF a first X-Y transport unit 10 which carries IC elements to be tested from a predetermined first buffer stage BS1 to the performance board PB on the test head TH and carries tested IC elements from the performance board PB to a second buffer stage BS2, and a second X-Y transport unit 20 which carries IC elements to be tested from a loader tray LT to a hot plate HP held at a predetermined temperature and thence to the first buffer stage BS1 held at a predetermined temperature, or carries the IC elements from the loader tray LT directly to the first buffer stage BS1, and carries tested IC elements from the second buffer stage BS2 to any one of an unloader tray UT and sort trays ST1 and ST2. The first and second X-Y transport units 10 and 20 can be driven in parallel. The first X-Y transport unit 10 has X-axis guide rails 1X, a Y-axis guide rail 1Y movable thereon in the X-axis direction and an X-Y carrier head 1H movable on the Y-axis guide rail 1Y in the Y-axis direction. The second X-Y transport unit 20 has X-axis guide rails 2X, a Y-axis guide rail 2Y movable thereon in the X-axis direction and an X-Y carrier head 2H movable on the Y-axis guide rail 2Y in the Y-axis direction.

The structure including the support frame SF and the horizontal transport mechanism mounted thereon is commonly referred to as an IC handler. The test head TH, which has on its top the performance board PB, is received in the IC handler and is detachably connected thereto, forming IC test equipment as a whole. When the test head TH is connected to the IC handler, the position of the performance board PB is fixed relative to the stationary coordinates of the horizontal transport mechanism. The subject application concerns IC test equipment having, for example, such a horizontal transport mechanism, and in particular, pertains to the first X-Y transport unit 10. Hence, the first X-Y transport unit 10 will hereinafter be referred to simply as the X-Y transport unit or horizontal transport mechanism as well.

Figure 3:
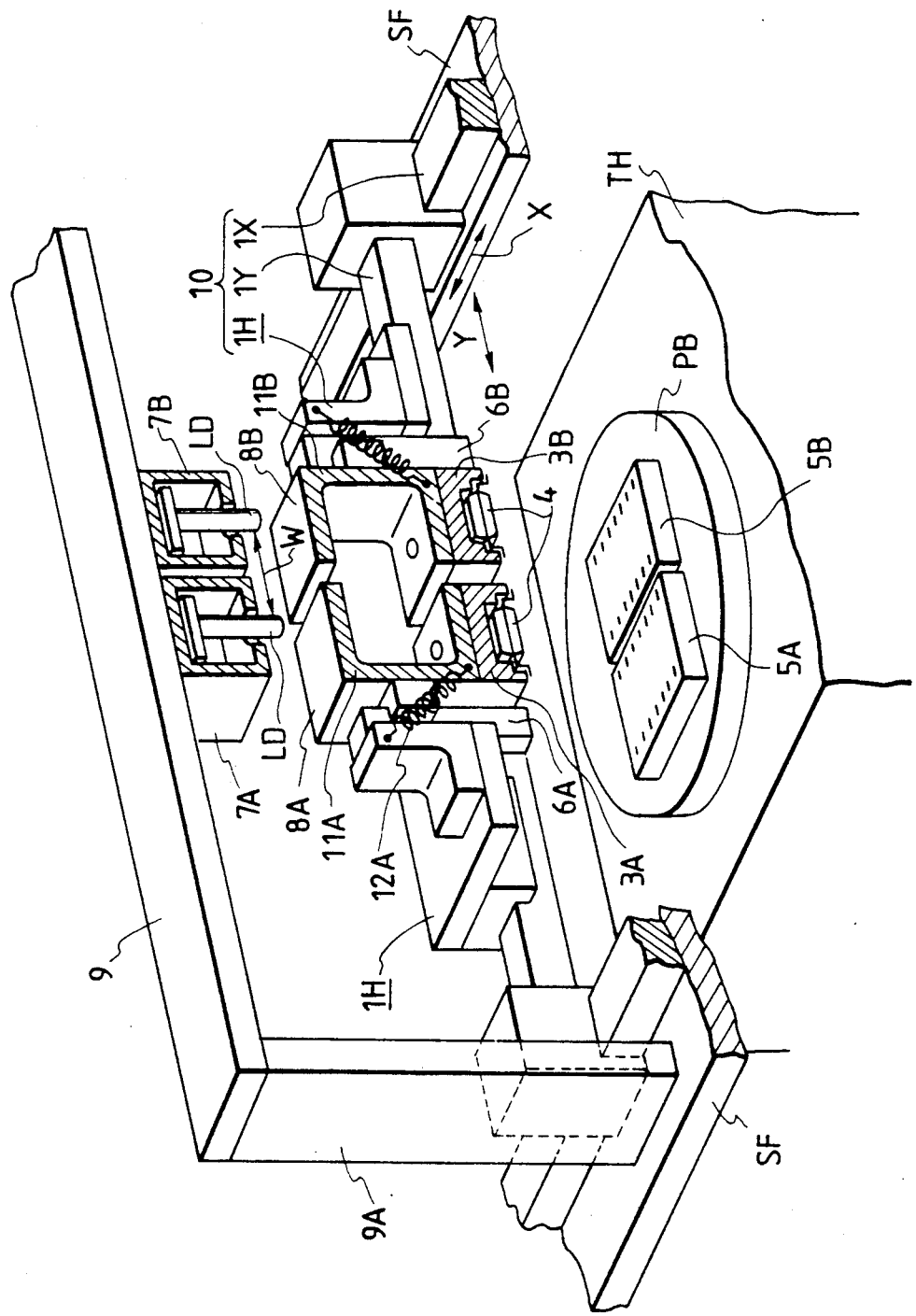
FIG. 3 is a perspective view, partly in section, showing an X-Y transport unit which forms the principal part of the present invention.

FIG. 3 illustrates an embodiment of the X-Y transport unit which forms the principal part of the present invention. In the subject invention the X-Y carrier head 1H has the air chucks 3A and 3B and vertical transmissions 11A and 11B, and the vertical drivers 7A and 7B are provided above the position to which the air chucks 3A and 3B are to be brought down. The vertical drivers 7A and 7B are mounted on a fixed beam 9 provided above the performance board PB and is fixed, by props 9A (one of which is shown) at its opposite ends, to the support frame SF on which the horizontal transport mechanism is mounted. The vertical drivers 7A and 7B have their movable rods LD attached, in a downward disposition, to the underside of the fixed beam 9. The spacing W of the rods LD is selected substantially equal to the spacing of the center positions of rod receiving surfaces 8A and 8B which are top faces of the vertical transmissions 11A and 11B mounted on the X-Y carrier head 1H.

The vertical transmissions 11A and 11B can be formed by, for instance, metallic members obtained by bisecting a rectangularly-sectioned metal tube, each of the air chucks 3A and 3B being mounted on the underside of the metallic member. The vertical transmissions 11A and 11B are supported by vertical guides 6A and 6B so that they can slide up and down relative to the X-Y carrier head 1H. The transmissions 11A and 11B are always biased upwardly by springs 12A and 12B to support the air chucks 3A and 3B at top dead center positions of the vertical guides 6A and 6B, respectively.

With such a structure as described above, when the X-Y carrier head 1H has come to stand still just above the performance board PB, the rods LD of the vertical drivers 7A and 7B lying above the performance board PB face the rod receiving surfaces 8A and 8B. Then, extending down the rods LD of the vertical drivers A and 7B, their tips abut against the rod receiving surfaces 8A and 8B of the vertical transmissions 11A and 11B, pressing down the air chucks 3A and 3B.

The air chucks 3A and 3B approach the sockets 5A and 5B mounted on the performance board PB and press terminals of the IC elements 4 into contact with contacts of the sockets 5A and 5B, and in order to maintain the contact, apply a pressure of around 30 kg to the terminals of the IC elements 4. In this instance, the driving force produced by the vertical drivers 7A and 7B is applied to the contacts of the sockets 5A and 5B through the terminals of the IC elements 4, and the resulting reaction force is applied to the fixed beam 9. Consequently, not only the weights of the vertical drivers 7A and 7B but also the pressure to the terminals of the IC elements and the reaction force are not ever applied to the X-Y carrier head 1H.

As described above, according to the present invention, the weight of the X-Y carrier head 1H can be reduced, since the vertical drivers 7A and 7B for moving up and down the air chucks 3A and 3B are mounted on the fixed beam 9. Furthermore, since no reaction force resulting from the pressure applied to the contacts of the sockets 5A and 5B through the terminals of the IC elements 4 is applied to the X-Y carrier head 1H, there is no need of increasing the rigidity of the entire structure of the X-Y transport unit 10. Hence, the overall weight of the X-Y transport unit 10 can also be reduced.

Thus, the present invention affords reduction of the total weight of the X-Y transport unit 10 including the X-Y carrier head 1H, and hence lessens the weight of the moving part as a whole. This permits high-speed driving of the IC transport system, i.e. increases the IC transportion speed, affording reduction of the IC testing time and consequently enabling a large number of IC elements to be tested in a short time.

It will be apparent that many modifications and variations may be effected without departing from the scope of the novel concepts of the present invention.

What is claimed is:

1. IC test equipment comprising:
   a test head provided with a performance board having at least one IC socket for connection of an IC element to be tested;
   support frame means having a position fixed relative to said test head;
   an X-Y transport unit mounted on said support frame and having an X-Y carrier head horizontally movable in a region above said support frame, including space above said test head;
   air chuck means supported by said X-Y carrier capable of sucking up and holding IC elements;
   vertical guide means whereby said air chuck means is supported in a manner to be movable in the vertical direction relative to said X-Y carrier head;
   a fixed beam means provided above said test head and fixed to said support frame means; and
   vertical driving means mounted on said fixed beam means, for applying force to said air chuck means to move it down.

2. The IC test equipment of claim 1, wherein said air chuck means includes vertical transmission means held by said vertical guide means in a manner to be slidable in the vertical direction and at least one air chuck for sucking up and holding said IC element to its underside, the top of said vertical transmission means forming a driving force receiving surface for receiving a downward pressure from said vertical driving means.

3. The IC test equipment of claim 2, wherein said air chuck means includes spring means for biasing said vertical transmission means upwardly.

4. The IC test equipment of claim 2 or 3, wherein said vertical driving means includes at least one air cylinder having at least one rod to be driven in the vertical direction, said at least one rod abutting against said driving force receiving surface of said vertical transmission means to press it down.

5. The IC test equipment of claim 3, wherein said vertical driving means includes at least one air cylinder having at least one rod to be driven in the vertical direction, said at least one rod abutting against said driving force receiving surface of said vertical transmission means to press it down.

* * * * *

UNITED STATES PATENT AND TRADEMARK OFFICE
CERTIFICATE OF CORRECTION

PATENT NO. : 5,177,435
DATED : JANUARY 5, 1993
INVENTOR(S) : TOSHIYUKI KIYOKAWA ET AL.

It is certified that error appears in the above-indentified patent and that said Letters Patent is hereby corrected as shown below:

Col. 2, line 27, "t" should be --transport--.

Col. 3, line 44, "drivers A" should be --drivers 7A--.

Col. 4, line 32, "carrier" should be --carrier head and--;
line 37, "a" should be deleted;
line 53, "2 or 3," should be --2,--.

Signed and Sealed this

Fourth Day of January, 1994

Attest:

BRUCE LEHMAN

*Attesting Officer*        Commissioner of Patents and Trademarks